US012328845B2

(12) United States Patent
Nikkhoo et al.

(10) Patent No.: US 12,328,845 B2
(45) Date of Patent: Jun. 10, 2025

(54) THERMAL CONDUIT FOR ELECTRONIC DEVICE

(71) Applicant: Meta Platforms Technologies, LLC, Menlo Park, CA (US)

(72) Inventors: Michael Nikkhoo, Saratoga, CA (US); Brian Toleno, Cupertino, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 325 days.

(21) Appl. No.: 17/556,719

(22) Filed: Dec. 20, 2021

(65) Prior Publication Data
US 2023/0200019 A1     Jun. 22, 2023

(51) Int. Cl.
*H05K 7/20*     (2006.01)
*G06F 1/16*     (2006.01)
(Continued)

(52) U.S. Cl.
CPC ......... *H05K 7/20436* (2013.01); *G06F 1/163* (2013.01); *G06F 1/206* (2013.01);
(Continued)

(58) Field of Classification Search
CPC ............. H05K 7/2039; H05K 7/20436; H05K 7/20445; H05K 7/20454; H05K 7/20463;
(Continued)

(56) References Cited

U.S. PATENT DOCUMENTS 5,255,738 A  *  10/1993  Przilas ................ H05K 7/205
                                                      165/905
5,769,158 A  *   6/1998  Yao ...................... F28F 13/00
                                                      165/905
(Continued)

FOREIGN PATENT DOCUMENTS

CN        201115224 Y  *  9/2008
CN        109640586 A  *  4/2019  ........... H05K 7/2039

OTHER PUBLICATIONS

International Search Report and Written Opinion for International Application No. PCT/US2022/053550, mailed Mar. 30, 2023, 10 pages.

(Continued)

*Primary Examiner* — Adrian S Wilson
*Assistant Examiner* — Gage Crum
(74) *Attorney, Agent, or Firm* — McDermott Will & Emery LLP

(57) ABSTRACT

A flexible thermal conduit includes a first material extending along an axial length of the thermal conduit, the first material having a first thermal conductivity, a second material encasing at least a portion of the first material, the second material having a second thermal conductivity that is less than the first thermal conductivity, and a thermally conductive silicone molded over at least a portion of the first material and the second material such that the thermally conductive silicone forms the first end and the second end of the thermal conduit. The thermal conduit may be used in electronic device, such as a wearable device, to transmit heat from a heat source (e.g., a processor) to a thermal ground (e.g., a housing).

20 Claims, 6 Drawing Sheets

(51) Int. Cl.
  *G06F 1/20* (2006.01)
  *F28F 21/02* (2006.01)
  *H01L 23/36* (2006.01)
  *H01L 23/373* (2006.01)

(52) U.S. Cl.
  CPC ............... *F28F 21/02* (2013.01); *H01L 23/36* (2013.01); *H01L 23/373* (2013.01); *H05K 7/20445* (2013.01); *H05K 7/20472* (2013.01)

(58) Field of Classification Search
  CPC ........... H05K 7/20472; H05K 7/20481; H05K 7/20963; G06F 1/163; G06F 1/203; G06F 1/206; G02B 27/0176; H01L 23/373; H01L 2924/161; F28D 15/02; F28D 15/0275; F28F 1/006
  See application file for complete search history.

(56) References Cited

U.S. PATENT DOCUMENTS

| | | | | |
|---|---|---|---|---|
| 6,060,166 | A * | 5/2000 | Hoover | F28F 13/00 165/83 |
| 6,131,651 | A * | 10/2000 | Richey, III | F28F 13/00 257/E23.101 |
| 6,286,591 | B1 * | 9/2001 | Bonneville | H05K 7/20445 165/185 |
| 6,367,509 | B1 * | 4/2002 | Bonneville | F28F 21/02 138/109 |
| 10,345,054 | B2 * | 7/2019 | Sauer | B32B 9/007 |
| 10,488,898 | B2 * | 11/2019 | Shah | G06F 1/1681 |
| 11,272,639 | B2 * | 3/2022 | Yang | G06F 1/203 |
| 11,521,910 | B2 * | 12/2022 | Cáceres | H01L 23/3737 |
| 11,744,045 | B2 * | 8/2023 | Lin | G06F 1/203 361/679.54 |
| 2006/0086493 | A1 * | 4/2006 | Fujiwara | H01L 23/373 165/185 |
| 2011/0056671 | A1 * | 3/2011 | Moon | F28D 15/00 165/185 |
| 2012/0087094 | A1 * | 4/2012 | Hill | F28F 21/085 361/720 |
| 2015/0211815 | A1 * | 7/2015 | Sauer | F28F 21/065 165/185 |
| 2016/0212887 | A1 * | 7/2016 | Nikkhoo | H05K 7/20418 |
| 2016/0212889 | A1 * | 7/2016 | Nikkhoo | H05K 7/20963 |
| 2018/0023904 | A1 * | 1/2018 | Kato | B32B 27/38 165/80.2 |
| 2018/0284856 | A1 * | 10/2018 | Shah | G06F 1/1616 |
| 2019/0249927 | A1 * | 8/2019 | Kim | H01L 23/427 |
| 2020/0307158 | A1 * | 10/2020 | Sinfield | B32B 37/06 |
| 2021/0068304 | A1 | 3/2021 | Strader et al. | |
| 2022/0338381 | A1 * | 10/2022 | Wu | F28F 3/02 |
| 2023/0019938 | A1 * | 1/2023 | Kim | C01B 32/20 |

OTHER PUBLICATIONS

International Preliminary Report on Patentability for International Application No. PCT/US2022/053550, mailed Jul. 4, 2024, 9 pages.

* cited by examiner

US 12,328,845 B2

THERMAL CONDUIT FOR ELECTRONIC DEVICE

BACKGROUND

Electronic components of electronic devices generate heat during operation. The amount of heat generated by components of an electronic device is generally related to a processing capability of such components as they consume electrical power and output heat while operating. As such, a temperature of the device and components thereof is often managed through various types of thermal management systems that draw heat away from components of the device and/or expel heat from the device. These thermal management systems are designed to maintain the temperature of components of the device within given operating ranges to ensure proper function of the components within the device. However, existing thermal management systems take up space, add weight, and may therefore not be well suited for use in certain electronic devices, such as wearable devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
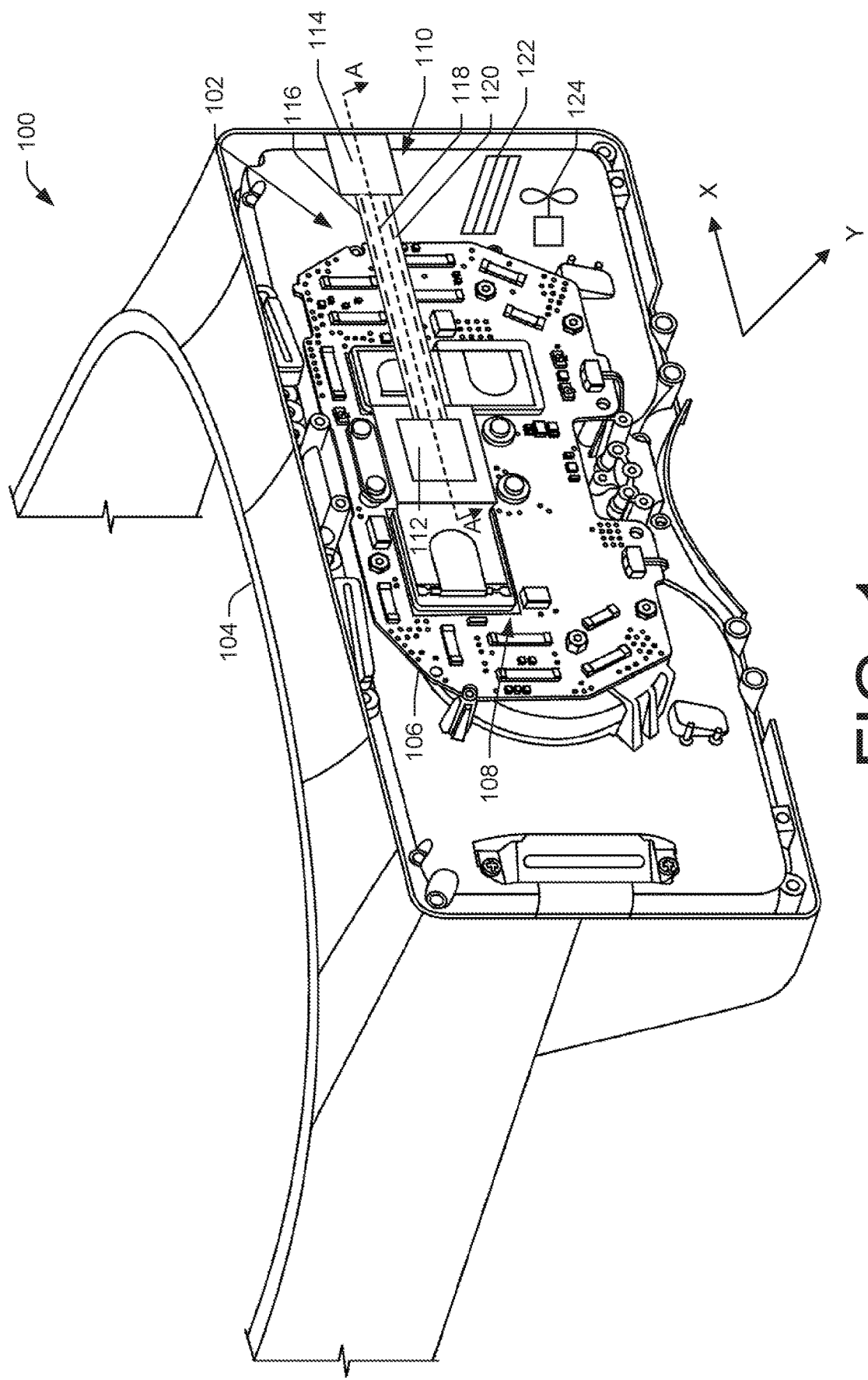
FIG. 1 illustrates a perspective view of an example electronic device having a thermal management system in accordance with an example of the present disclosure.

Electronic devices generate heat from various components and, as such, it is important to manage temperatures of the components of the electronic device. This application describes a thermal management system for managing a temperature of an electronic device and/or components thereof. The thermal management system may include a thermal conduit disposed within a housing of the electronic device. The thermal conduit may be configured to manage a temperature of one or more components of the electronic device by transferring thermal energy between components of an electronic device. For example, the thermal conduit may transfer thermal energy from component(s) of the electronic device to a housing, heat sink, thermal ground, or other component of the electronic device. The housing (or other component) may disperse the thermal energy to an environment surrounding the headset or may disperse the thermal energy across a heat sink or thermal ground.

In some examples, the thermal conduit may evenly disperse thermal energy across the housing, heat sink, or thermal ground so as to prevent hotspots from forming on an exterior surface of the housing. Such hotspots on the housing may cause user discomfort when the electronic device is secured to the user, is held by the user, or otherwise contacted by the user. Additionally, or alternatively, the thermal conduit described herein may unevenly direct thermal energy to the housing, heat sink, or thermal ground in order to reduce a temperature of the housing at locations where the housing contacts a user when the electronic device is secured to the user.

For example, when the electronic device includes a wearable headset, glasses, or other face mounted device, the thermal conduit may draw thermal energy away from a face of the user and direct the thermal energy to a temple region (or other portion of the wearable headset) of the user. As such, the thermal conduit may draw thermal energy away from particularly sensitive regions of a user and direct the thermal energy to portions of the device that are located proximate less sensitive regions of the user or portions of the device that are not in contact with the user.

In some examples, the thermal conduit includes a pyrolytic graphite core that is coated with or bonded to one or more thin layers of copper or polyethylene terephthalate (PET). The conduit provides a strong, flexible, light-weight, and highly thermally transmissive conduit that efficiently transfers thermal energy between components of an electronic device. The conduit may be coupled to components of the device by a thermally conductive silicone matrix that provides strong adhesion to the pyrolytic graphite core via the copper or PET. The thermally conductive silicone matrix may also provide strong adhesion between the thermal conduit and one or more components of the device.

In some examples, the thermal management system may be used in electronic devices such as, but not limited to, a head-mounted device (e.g., an electronic headset device, glasses, etc.) or other wearable device. Such head-mounted devices are referred to herein as "headsets" and may include extended reality headsets that allow users to view, create, consume, and share media content. In some examples, the headset may include a display structure having a display which is placed over eyes of a user and allows the user to "see" the extended reality. As discussed further below, the term "extended reality" includes virtual reality, mixed reality, and/or augmented reality.

As used herein, the term "virtual environment" or "extended reality environment" refers to a simulated environment in which users can fully or partially immerse themselves. For example, an extended reality environment can comprise virtual reality, augmented reality, mixed reality, etc. An extended reality environment can include objects and elements with which a user can interact. In many cases, a user participates in an extended reality environment using a computing device, such as a dedicated extended reality device. As used herein, the term "extended reality device" refers to a computing device having extended reality capabilities and/or features. In particular, an extended reality device can refer to a computing device that can include any device capable of presenting a full or partial extended reality environment.

Additionally, and/or alternatively, the thermal management system may be used in devices, such as, but not limited to, a wrist wearable device (e.g., a smartwatch or controller), a hand wearable device, a head-mounted device (e.g., glasses, an electronic headset device), or other wearable device. Examples of wrist wearable devices may include smartwatches that may execute mobile applications, mobile operating system(s), output media content, provide connectivity to one or more other devices (e.g., via Wi-Fi, mobile networks, Bluetooth®, global positioning system (GPS), etc.), monitor health or fitness (and associated metrics) of a user, among other operations. The wearable device described herein may also include a display and touchscreen interface that allows users to view, create, consume, and share media content. Furthermore, the wearable device described herein may be connected to one or more other devices and may be configured to control one or more functions of the other devices based in part on user input received via the wearable device.

While examples of electronic devices are provided above, it is to be understood that the thermal management system described herein may be implemented in any type of electronic device including, but not limited to, mobile phones (e.g., cell phones, smart phones, etc.), tablet computing devices, electronic book reader devices, laptop or all-in-one computers, media players, portable gaming devices, televisions, monitors, cameras, wearable computing devices, electronic picture frames, audio virtual assistant devices, radios, speakers, personal computers, external hard drives, input/output devices (e.g., remote controls, game controllers, keyboards, mice, touch pads, microphones, speakers, etc.), and/or the like.

In some examples, the electronic device may include a housing configured to house one or more components of the wearable device. For example, the electronic device may include a printed circuit board (PCB) disposed within the housing. In some examples, one or more electronic components may be disposed on or coupled to the PCB. For example, the PCB may include one or more integrated circuits coupled thereto. The PCB may further include memory, processor(s), circuitry, or other electronic components coupled hereto. In some examples, the thermal conduit may be coupled directly or indirectly to one or more electronic components such that the thermal conduit is disposed in thermal contact with the one or more electronic components. Additionally, or alternatively, the thermal conduit can be disposed in thermal contact with one or more heat sinks associated with the one or more electronic components. In either example, the thermal conduit may be configured to draw thermal energy from the one or more electronic components (and/or associated heat sinks) and to transfer the thermal energy to other components of the electronic device.

In some examples, such other components to which thermal energy is transferred may include the housing of the electronic device. For example, the thermal conduit may draw thermal energy from an electronic component that generates thermal energy and may transfer the thermal energy to the housing where the thermal energy is dispersed to an environment surrounding the electronic device. In some examples, such other components may additionally or alternatively include one or more thermal frames, thermal grounds, additional heat sinks, cooling blocks, radiators, or other components configured to manage thermal energy within the electronic device.

In some examples, the thermal conduit includes a thermal pathway formed from a first material at least partially covered or encased by a second material. The thermal pathway may be strong, flexible, light, and highly-thermally conductive. In some examples, the first material is formed from a highly thermally conductive material such as pyrolytic graphite. The pyrolytic graphite may form a core of the conduit as the pyrolytic graphite includes a high thermal conductivity. As such, as the thermal conduit draws thermal energy from one or more components of the electronic device, the thermal energy may be efficiently and quickly transferred across the first material.

In some examples, the pyrolytic graphite may be layered such that the first material includes multiple stacked layers, where the layers extend in substantially parallel directions. The pyrolytic graphite may conduct thermal energy anisotropically meaning that the pyrolytic graphite includes a higher thermal conductivity in plane (or along a length of the pyrolytic graphite), but a lower thermal conductivity out of plane (or perpendicular to the length of the pyrolytic graphite).

In some examples, the second material is bonded, adhered, or otherwise coupled to the first material. The second material may coat or encase the first material such that a length of the second material is substantially equal to the first material. In some examples, the second material may be applied to a top, bottom, and/or sides of the first material and may be applied along substantially an entire length of the first material. Alternatively, the second material may be applied to a portion of the length of the first material (e.g., less than an entire length of the first material) and/or the second material may be applied to less than all sides of the first material (e.g., the second material may be applied to a top and bottom of the first material but not the sides). Furthermore, end surfaces of the first material may be substantially free from the second material. In some examples, keeping the end surfaces of the first material free from the second material allows the first material to be disposed in direct thermal contact with other components (such as the silicone matrix described herein) of the thermal conduit. In some examples, the second material may stop short of the ends of the first material to provide additional contact area around the perimeter of the first material to contact the silicone matrix or other components/materials.

In some examples, the first material may be prone to flaking and/or migration within the electronic device and, as such, the second material seals the first material to mitigate and/or prevent contamination within the electronic device. The second material may also provide structural support to the thermal conduit as well as flexibility. Furthermore, the second material may provide a suitable surface to which the silicone matrix may be bonded or adhered. In some examples, the silicone matrix may bond or adhere poorly to the pyrolytic graphite. Thus, the second material allows the silicone matrix to be bonded or adhered to the thermal pathway while also allowing the first material to be in thermal contact with the silicone matrix, thereby maintaining high thermal conductivity of the thermal conduit.

The second material may be formed from, for example, copper or polyethylene terephthalate (PET). However, other materials may additionally or alternatively be used for the second material, such as plastics (e.g., polyimide film such as Kapton), metals (e.g., sheets or foils made of silver, aluminum, tin, gold, platinum, etc.). In some examples, the second material is wetted to the first material to bond or adhere the second material to the first material. Such wetting may improve a bond between the second material and the first material. In some examples, various methods or stimuli may be implemented to improve wetting between the second material and the first material. Such methods and stimuli may include, but are not limited to, removing contamination between two surfaces being bonded, corona surface treatment, atmospheric plasma, among other methods and/or stimuli. Additionally or alternatively, the second material may be adhered to the first material via a pressure sensitive adhesive (PSA).

As mentioned previously, the thermal conduit may further include a thermally conductive silicone matrix applied to ends of the thermal pathway (e.g., applied to ends and/or perimeters of the first material and/or the second material). The thermally conductive silicone matrix may be formed from a silicone material that includes one or more added materials that may improve the thermal conductivity of the silicone matrix. In some examples, such materials may include metallic particles such as silver particles, metal oxides (e.g., aluminum oxide, aluminum nitride, etc.), metal coated particles, or other added materials.

In some examples, the silicone matrix may be overmolded (or otherwise disposed) on ends of the thermal pathway. For example, the silicone matrix may include a first portion that is overmolded on a first end of the thermal pathway such that the first portion is molded over at least a portion of the first material and the second material. The silicone matrix may also include a second portion that is overmolded on a second end of the thermal pathway such that the second portion is molded over at least a portion of the first material and the second material. In some examples, the first portion and the second portion of the silicone matrix may form a first end and a second end of the thermal conduit, respectively.

In some examples, the first portion and the second portion of the silicone matrix may be coupled to or otherwise disposed in contact with components of the electronic device. For example, the first portion of the silicon matrix may be coupled to a processor, radio, display, driver, memory, battery (or other thermal energy generating component) while the second portion of the silicone matrix may be coupled to a housing of the electronic device such that the thermal conduit draws thermal energy from the thermal energy generating component (through the first portion of the silicone matrix) and transfers the thermal energy to the housing (via the second portion of the silicone matrix).

Furthermore, the silicone matrix may be compressible such that the first portion and the second portion of the silicone matrix may conform to various complex shapes or geometries of an electronic device and/or components thereof. By compressing the silicone matrix, the silicone matrix may fill any air gaps between the silicone matrix and an adjacent component or portion of the electronic device, thereby increasing thermal conductivity therebetween. Following the example given above, the second portion of the silicone matrix may be compressed within a housing of the electronic device, thereby eliminating gaps between the housing and the second portion of the silicone matrix, which, in turn, improves thermal conductivity therebetween.

These and other aspects are described further below with reference to the accompanying drawings and appendices. The drawings are merely example implementations and should not be construed to limit the scope of the claims. For example, while examples are illustrated in the context of a head-mounted electronic device, the techniques may be used in association with any electronic device including, but not limited to, those described at various locations throughout this application.

FIG. 1 illustrates a perspective view of an example electronic device 100 having a thermal management system 102. In some examples, the thermal management system 102 is located within a housing 104 of the electronic device 100. While FIG. 1 shows the housing 104 as being open ended (i.e., not having a front portion of the housing), it is to be understood that the housing 104 may include a front portion such that the electronic device 100 is enclosed via the housing 104, and the electronic device 100 is merely shown without the front portion to show the various components located within the housing 104. As mentioned previously, the thermal management system 102 may be configured to draw thermal energy from one or more components of the electronic device 100 and to transfer the thermal energy to an environment surrounding the electronic device 100, a thermal ground, heat sink, or other location within the electronic device 100 or outside of the electronic device 100.

In some examples, the electronic device 100 includes a printed circuit board (PCB) having one or more electronic components 108 coupled thereto. The one or more electronic components 108 may be coupled to the PCB 106 such that some and/or all of the one or more electronic components 108 are electrically and/or communicatively coupled to one another. Furthermore, the PCB 106 provides a substrate to which the one or more electronic components 108 are mounted within the housing 104 of the electronic device 100. Such electronic components 108 may include, but are not limited to, one or more central processing units (CPUs), graphics processing units (GPUs), holographic processors, radio frequency (RF) transceivers, display driver integrated circuits (DDIC) or other display drivers, memory, batteries or other power sources, global positioning systems (GPS), sensors, speakers, etc. Examples of RF transceivers may be configured to receive and/or transmit RF signals associated with Wi-Fi™, Bluetooth®, 3G, 4G, LTE, 5G, or other wireless data transmission technologies. In some examples, the sensors may include one or more microphones, light sensors, near field communication (NFC) systems, buttons, touch sensors, accelerometers, gyroscopes, magnetometers, inertial sensors, heart rate sensors, oxygen sensors, temperature sensors, moisture sensors, etc.

In some examples, the thermal management system 102 includes a thermal conduit 110 disposed within the housing 104 of the electronic device 100. The thermal conduit 110 may include a first end 112 in direct or indirect thermal contact with the one or more electronic components 108 that are mounted on the PCB 106. The thermal conduit 110 may also include a second end 114 in direct or indirect thermal contact with the housing 104, a thermal ground, heat sink, thermal frame, or other component of the electronic device 100. As such, the thermal conduit 110 is configured to receive thermal energy from the one or more electronic components 108 of the electronic device 100 and is configured to transfer thermal energy toward an environment located outside of the housing 104 or toward a predetermined location within the housing 104 such as a thermal ground or heat sink that may receive, store, and/or disperse thermal energy.

In some examples, the thermal conduit 110 may include a thermal pathway 116 disposed between the first end 112 and the second end 114 of the thermal conduit 110. The thermal pathway 116 may be flexible such that the thermal conduit 110 may take any shape and may be implemented in complex geometries within an electronic device. The thermal pathway 116 may include a first material 118 that is at least partially encased by a second material 120. The thermal pathway 116 may provide a strong, flexible, light, and highly-thermally conductive pathway across which thermal energy may be transferred quickly and efficiently. In some examples, the thermal pathway be disposed in direct or indirect contact 116 with one or more electronic components of the electronic device 100 and may draw thermal energy from the one or more electronic components and may transfer the thermal energy toward the predetermined location within the housing 104. As such, the thermal conduit 110 may be disposed in direct or indirect thermal contact with multiple electronic components and the thermal conduit 110 may be configured to draw thermal energy from such electronic components.

Furthermore, it is noted that the thermal conduit 110 and components thereof are not shown to scale and the thermal conduit 110 and thermal pathway 116 may be formed from relatively small components (example dimensions will be described further herein). Due to the strength, flexibility, small size, light weight, and thermal efficiency of the thermal pathway 116, the thermal conduit 110 may be used to transfer thermal energy through complex geometries of the electronic device 100.

In some examples, the thermal management system 102 may include one or more vents 122 formed in the housing 104. The one or more vents 122 may be disposed in any portion of the housing 104. Furthermore, the one or more vents 122 may instead be slots, louvres, or other apertures. The one or more vents 122 may allow thermal energy located within the housing 104 to be dissipated to an environment outside of the housing 104 via convection. The thermal management system 102 may also include one or more fans 124 that are located within the housing 104 of the electronic device 100. The one or more fans 124 may be oriented to blow air across the second end 114 of the thermal strap 102 and/or to force air out of the one or more vents 122 to dissipate thermal energy to an environment surrounding the electronic device 100. Furthermore, in some examples, the one or more fans 124 may direct airflow throughout the electronic device 100.

Figure 2A:
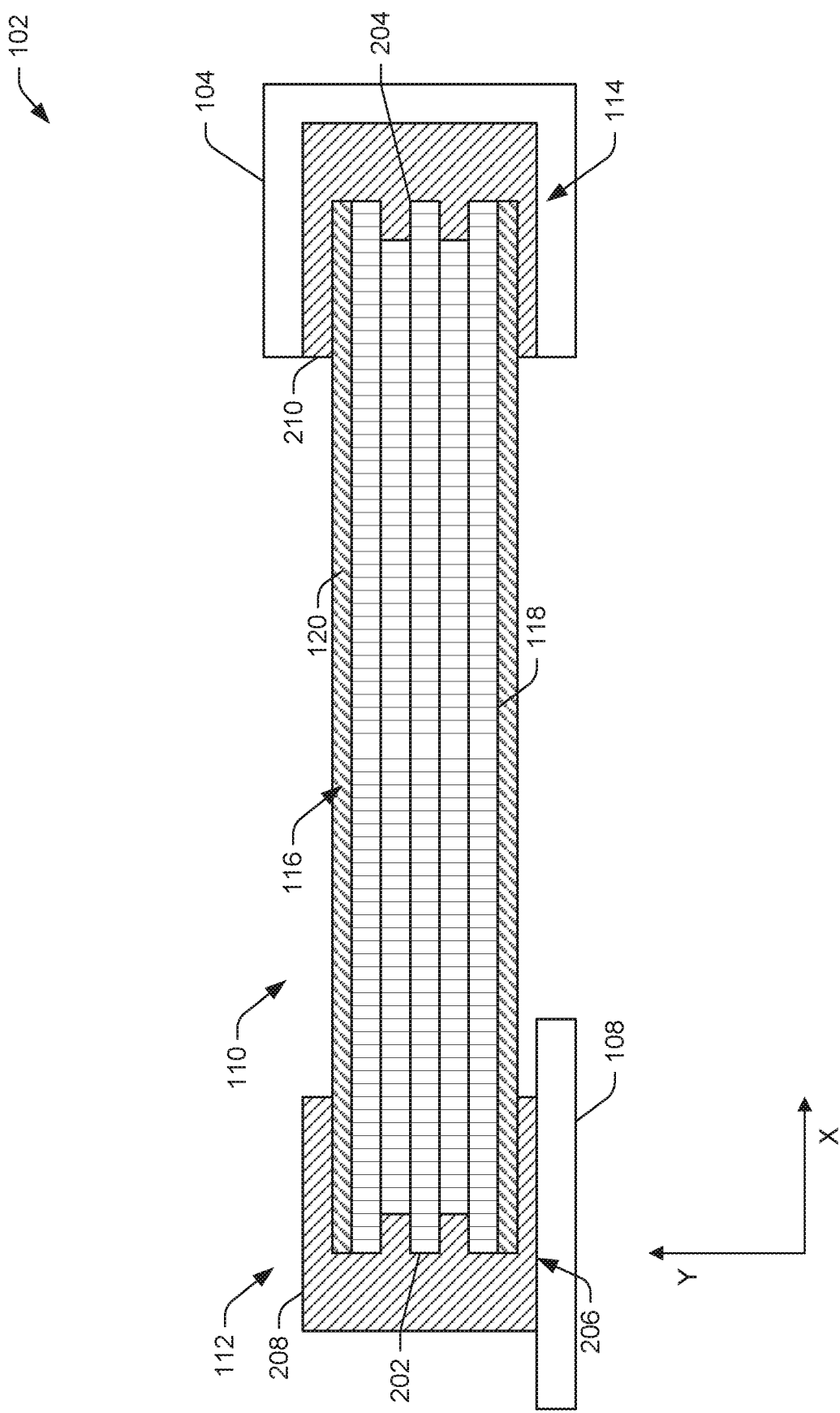
FIG. 2A illustrates a schematic cross-sectional view of a thermal management system in accordance with an example of the present disclosure.

FIG. 2A illustrates a schematic cross section of the thermal conduit 110, taken along line A-A, as shown and described in FIG. 1. It is noted that FIG. 2A is not drawn to scale and various components illustrated in FIG. 2A may be relatively larger or smaller than depicted. As mentioned previously, the thermal conduit 110 includes a thermal pathway 116 disposed between the first end 112 and the second end 114 of the thermal conduit 110. In some examples, the first end 112 of the thermal conduit 110 may be coupled to an electronic component 108 (or heat sink associated therewith) of the electronic device. Furthermore, the second end 114 of the thermal conduit 110 may be coupled to the housing 104, a thermal ground, heat sink, thermal frame, or other component of the electronic device. As such, the thermal conduit may be configured to draw thermal energy form the electronic component 108 and to transfer the thermal energy to the housing 104.

In some examples, the thermal pathway 116 includes the first material 118 and the second material 120. The first material 118 may extend along an axial length of the thermal pathway 116. In some examples, the first material 118 may be formed from pyrolytic graphite. Furthermore, the first material 118 may be formed from multiple layers of pyrolytic graphite. For example, and as shown in FIG. 2A, the first material 118 may include multiple layers of pyrolytic graphite layered on top of each other. For example, the first material 118 may include between 2 layers and 20 layers. In some examples, individual layers of the first material 118 may be staggered and/or may include varying lengths such that ends of the first material 118 may be uneven. By staggering and/or including varying lengths of the individual layers of the first material 118, a surface area of the first material 118 that contacts the silicone matrix 206 may be increased. While FIG. 2A depicts the individual layers of the first material 118 as having varying lengths it is to be understood that the individual layers may instead be staggered or the individual layers may be arranged such that ends of the first material 118 may include a cone or inverse cone shape, thereby increasing the surface area of the first material 118 that contacts the silicone matrix 206. Furthermore, in some examples, the first material 118 may include any number of layers of pyrolytic graphite and/or other layered material. For instance, in some examples, the first material may include alternating layers of thermally transmissive and thermally insulative material. Alternatively, the first material 118 may include a single layer of pyrolytic graphite or other material.

The pyrolytic graphite may form a core of the thermal conduit 110 as pyrolytic graphite has a high thermal conductivity. For example, the first material 118 may include a thermal conductivity that is substantially equal to or greater than 750 W/m-K. In some examples, the first material 118 may include a thermal conductivity with a K-value (i.e., watts per meter-Kelvin (W/m-K)) between approximately 750 and approximately 1750, between approximately 900 and approximately 1600, or between approximately 1000 and approximately 1500. In some examples, the first material 118 may include different K-values in different directions. For example, the first material 118 may include a first K-value in an in-plane direction (along the X-axis) through the first material 118 and a second K-value in a through-plane direction (along the Y-axis) through the first material 118 where the second K-value is different than the first K-value. The first and second K-values may be within the ranges described previously and, in some examples, the first K-value may be greater than the second K-value. Due at least in part to the high thermal conductivity of the first material 118, the thermal conduit 110 may transfer thermal energy across the thermal conduit 110 at substantially high speeds and efficiencies.

The first material 118 may be relatively thin and flexible such that the first material 118 may be shaped to conform to various complex geometries within an electronic device. For example, a thickness (a dimension of the first material 118 in the Y-direction) may be between approximately 20 microns and approximately 120 microns, between approximately 30 microns and approximately 110 microns, or between 40 microns and approximately 100 microns. In some examples, such ranges may be the ranges of an individual layer of the first material 118 and multiple layers of the first material 118 may be stacked on each other. Furthermore, a length (a dimension of the first material 118 in the X-direction) of the first material 118 may be sized to accommodate any space between components of the electronic device. For example, the length of the first material may be between approximately 10 mm and approximately 300 mm. However, in some examples, the first material 118 may be shorter than or longer than the dimensions described above.

The thermal pathway 116 also includes the second material 120 that at least partially encases the first material 118. The second material 120 may likewise extend along an axial length of the thermal pathway 116. In some examples, the second material 120 is bonded, adhered, or otherwise coupled to the first material 118. In some examples, the second material 120 may include a length that is substantially similar to the first material 118 such that the second material 120 coats or encases the first material 118. However, the first material 118 may include a first end surface 202 and a second end surface 204 that are substantially free from the second material 120. By keeping the end surfaces 202 and 204 of the first material 118 free from the second material 120, the first material 118 may be disposed in direct thermal contact with a silicone matrix (described further herein) that is molded over ends of the first material 118 and the second material 120.

In some examples, the second material 120 may encapsulate the first material 118 as the first material 118 may be prone to flaking. As such, the second material 120 may mitigate and/or prevent contamination from the first material 118 flaking within the electronic device. The second material 120 may also provide structural support for the thermal conduit 110 while also providing flexibility along with the first material 118, thereby allowing the thermal conduit 110 to be implemented in tight and/or complex geometries within an electronic device. Still further, the second material 120 may provide a surface to which the silicone matrix may be bonded or adhered. In some examples, the silicone matrix may bond or adhere poorly to pyrolytic graphite due to its material properties. As such, the second material 120 provides a surface to which the silicone matrix may bond or adhere to well, while also allowing the first material 118 to be in thermal contact with the silicone matrix, thereby maintaining high thermal conductivity of the thermal conduit 110.

In some examples, the second material 120 may be copper or polyethylene terephthalate (PET). In some examples, the second material 120 may be wetted to the first material 118 to bond or adhere the second material 120 to the first material 118. Such wetting may improve a bond between the second material 120 and the first material 118. Additionally, and/or alternatively, the second material 120 may be adhered to the first material 118 via a pressure sensitive adhesive (PSA).

As mentioned previously, the second material 120 may include a length that is substantially similar to the first material 118. In some examples, the second material may include a thickness (dimension of the second material 120 in the Y-direction) between approximately 3 microns and approximately 20 microns, between approximately 5 microns and approximately 15 microns, or between approximately 7 microns and approximately 12 microns.

The thermal conduit may further include a thermally conductive silicone matrix 206 (referred to herein as "the silicon matrix 206") applied to end of the thermal pathway 116. In some examples, the silicone matrix 206 may include a thermal conductivity with a K-value (i.e., watts per meter-Kelvin (W/m-K)) between approximately 1 and approximately 60, between approximately 3 and approximately 40, or between approximately 5 and approximately 20. In some examples, the silicone matrix 206 may include a relatively soft, compressible material having a hardness under about 90A (Shore A) and/or a Young's modulus under 5 MPa. While described as a silicone matrix, it is to be understood that the silicone matrix 206 (and portions thereof) may include additional or other materials including urethane or other hybrid polymer. In some examples, the silicone matrix 206 may have a thickness ranging from 0.5 mm and 2 mm. In examples, the silicone matrix 206 may have a thickness of about 0.5 mm, 0.75 mm, 1 mm, 1.25 mm, 1.50 mm, 1.75 mm, 2 mm or within a range defined by any two of these examples. The silicone matrix 206 may be formed from uniform contiguous layers or layers of patterned material.

In some examples, the silicone matrix 206 may be overmolded or otherwise coupled to ends of the thermal pathway 116. The silicone matrix 206 may include a first portion 208 overmolded on a first end of the thermal pathway 116 such that the first portion 208 of the thermal matrix 206 is molded over at least a portion of the first material 118 and the second material 120. The silicone matrix 206 may also include a second portion 210 that is overmolded on a second end of the thermal pathway 116 such that the second portion 210 of the thermal matrix 206 is molded over at least a portion of the first material 118 and the second material 120. In some examples, the first portion 208 and the second portion 210 of the silicone matrix 206 may form at least a portion of the first end 112 and the second end 114 of the thermal conduit 110, respectively. As such, the thermal pathway 116 may be at least partially embedded within the first portion 208 and the second portion 210 of the silicone matrix 206.

In some examples, the first portion 208 of the silicon matrix 206 may be coupled to the electronic component 108 (or heat sink associated therewith) of the electronic device 100 while the second portion 210 of the silicone matrix 206 may be coupled to the housing 104 of the electronic device such that the thermal conduit 110 draws thermal energy from the electronic component 108 (through the first portion 208 of the silicone matrix 206) and transfers the thermal energy to the housing 104 (via the second portion 210 of the silicone matrix 206).

In some examples, the housing 104 is formed from a material having a high emissivity such that the housing 104 efficiently transfers thermal energy to an environment surrounding the electronic device 100. For example, the material that forms the housing 104 may include an emissivity coefficient between approximately 0.400 and approximately 0.995, between approximately 0.500 and approximately 0.950, or between approximately 0.700 and approximately 0.900. Additionally, or alternatively, in some examples, the second portion 210 of the silicone matrix 206 may be coupled to a heat spreader that is coupled to the housing 104 and is configured to spread thermal energy across a greater area of the housing 104. Furthermore, in some examples, the second portion 210 of the silicone matrix 206 may be coupled to a heat sink. The heat sink may be disposed within the housing 104 of the electronic device 100. In such an example, the one or more fans 124 may force air over the heat sink and out of the one or more vents 122 in the housing 104. Alternatively, the heat sink may protrude at least partially through the housing 104 and may exhaust thermal energy directly to an environment surrounding the electronic device 100.

Furthermore, the silicone matrix 206 may be compressible such that the first portion 208 and the second portion 210 of the silicone matrix 206 may conform to various complex shapes or geometries of an electronic device and/or components thereof. By compressing the silicone matrix 206, the silicone matrix 206 may fill any air gaps between the silicone matrix 206 and an adjacent component or portion of the electronic device, thereby increasing thermal conductivity therebetween. This is illustrated in FIG. 2A as the second portion 210 of the silicone matrix 206 is shown as filling a space within the housing 104 of the electronic device. By eliminating gaps between components of the electronic device and the silicone matrix 206, thermal conductivity may be improved therebetween.

In some examples, the first portion 208 and the second portion 210 of the silicone matrix 206 may be substantially similar in size. Furthermore, the first portion 208 and the second portion 210 of the silicone matrix 206 may include a thickness (a dimension along the Y-axis) and/or a length (a dimension along the X-axis) between approximately 0.5 mm and approximately 5 mm, between approximately 1 mm and approximately 4 mm, or between approximately 2 mm and approximately 3 mm. However, in some examples, the first portion 208 and the second portion 210 of the silicone matrix 206 may include a thickness and a length greater than or less than the dimensions provided above.

Figure 2B:
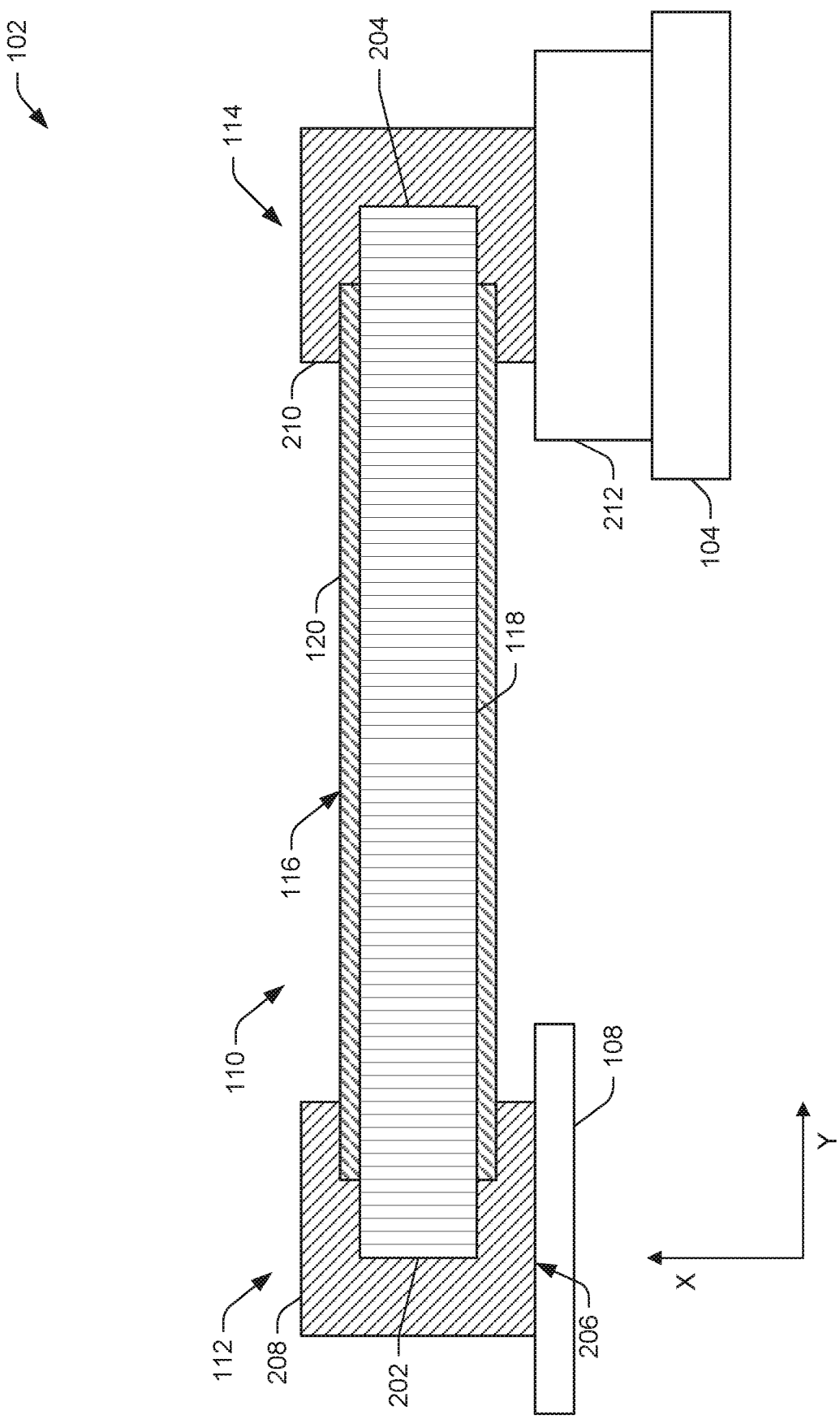
FIG. 2B illustrates a schematic cross-sectional view of another thermal management system in accordance with an example of the present disclosure.

FIG. 2B illustrates a schematic cross section of the thermal conduit 110, taken along line A-A, as shown and described in FIG. 1. FIG. 2B illustrates an alternate configuration of the thermal conduit 110. For example, as shown and described in FIG. 2A, the second material 120 may be applied to the first material 118 such that the second material 120 coats or encases the first material 118 such that a length of the second material 120 is substantially equal to the first material 118. Alternatively, and as shown in FIG. 2B, the second material 120 may be applied to a portion of the length of the first material 118 such that the second material is applied to less than an entire length of the first material 118. As such, ends of the first material 118 may be substantially free of the second material 120. In such a configuration, ends of the first material 118 extend beyond the second material 120 and contact the first portion 208 and the second portion 210 of the silicone matrix 206.

Furthermore, FIG. 2B depicts an alternate configuration of the second end 114 of the thermal conduit 110. In some examples, the second portion 110 of the silicone matrix 206 may be coupled to a heat exchanger 212 which may be coupled to the housing 104 of the electronic device or another component thereof. For example, the heat exchanger 212 may be a heat spreader that is coupled to the housing 104 and is configured to spread thermal energy across a greater area of the housing 104. As such, the heat spreader may reduce hot spots on the housing 104 of the electronic device and may transfer thermal energy to a larger region of the housing 104 of the electronic device where the thermal energy may be dissipated to an environment surrounding the electronic device. Furthermore, the heat exchanger 212 may include a heat sink that may be at least partially disposed within the housing 104 of the electronic device 100. In such an example, one or more fans may force air over the heat sink and out of one or more vents in the housing 104. Alternatively, the heat sink may protrude at least partially through the housing 104 and may exhaust thermal energy directly to an environment surrounding the electronic device 100.

Figure 2C:
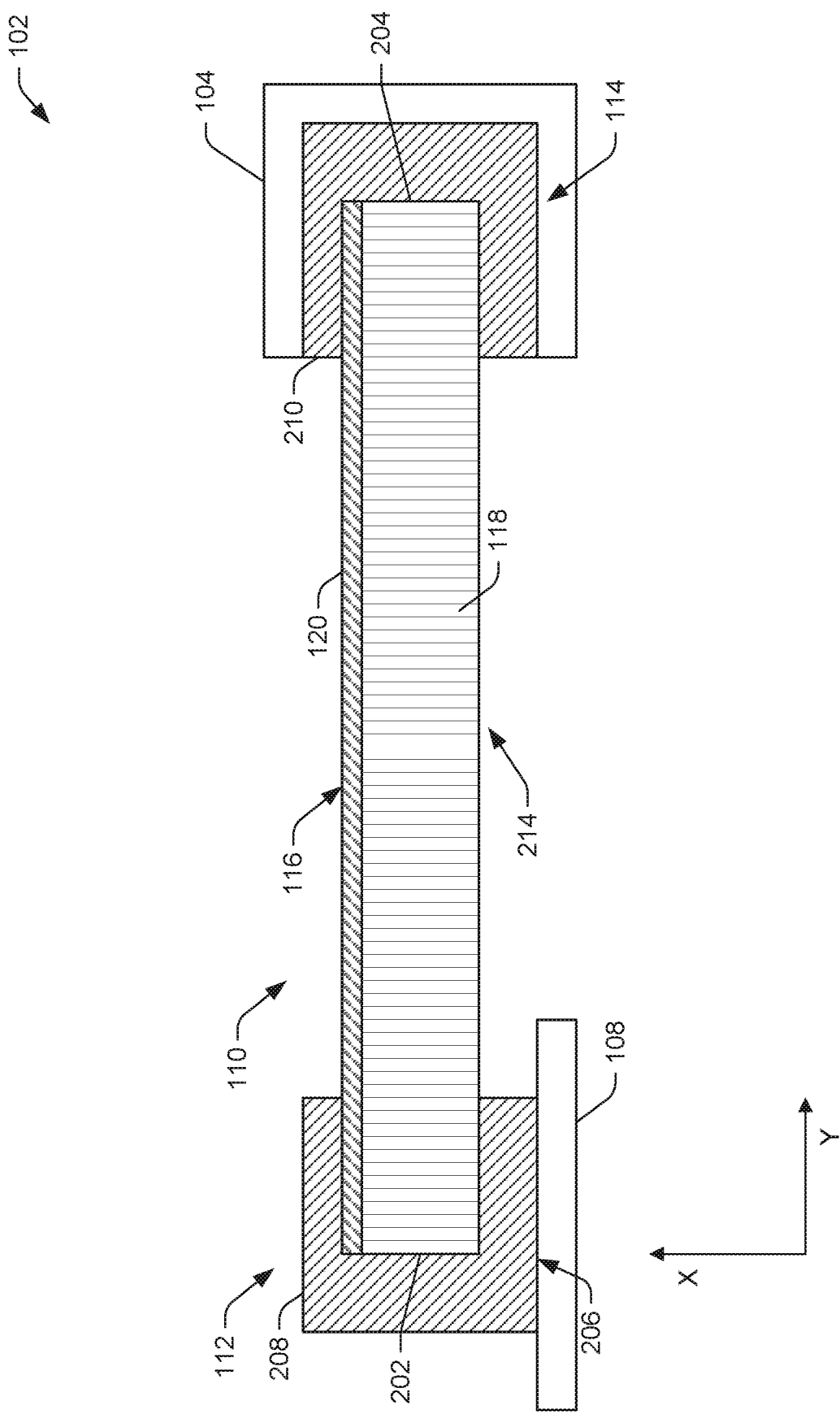
FIG. 2C illustrates a schematic cross-sectional view of another thermal management system in accordance with an example of the present disclosure.

FIG. 2C illustrates a schematic cross section of the thermal conduit 110, taken along line A-A, as shown and described in FIG. 1. FIG. 2C illustrates an alternate configuration of the thermal conduit 110. For example, the second material 120 may be applied to the first material 118 such that the second material 120 covers less than all sides of the first material 118. As such, a side of the first material 118 may be substantially free of the second material 120. While showing a bottom side 214 of the first material 118 as being substantially free of the second material 120, it is to be understood that any and/or multiple sides of the first material 118 may be substantially free of the second material 120. Furthermore, in some examples, the first material 118 may be substantially cylindrical. As such, a portion of the first material 118 may be substantially free of the second material. In such an example, the portion of the first material 118 that is substantially free of the second material 120 may extend along a circumference of the first material 118 or along an axial length of the first material 118. Furthermore, the first material 118 may include multiple portions that are substantially free of the second material 120. In such examples, an adhesive or sealant may be applied to portions of the first material 118 that are substantially free of the second material 120.

Figure 2D:
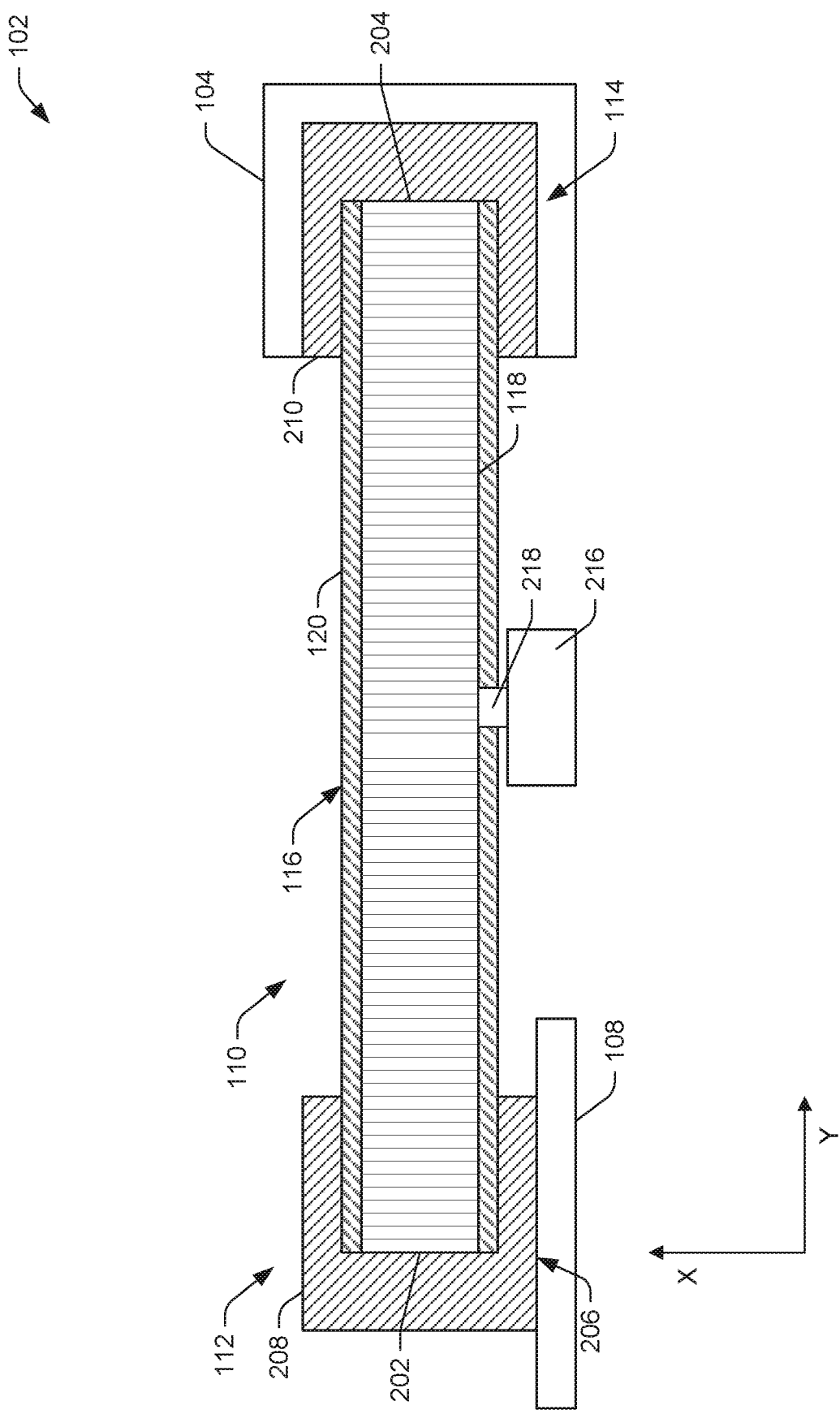
FIG. 2D illustrates a schematic cross-sectional view of another thermal management system in accordance with an example of the present disclosure.

FIG. 2D illustrates a schematic cross section of the thermal conduit 110, taken along line A-A, as shown and described in FIG. 1. FIG. 2D illustrates an alternate configuration of the thermal conduit 110. As shown in FIG. 2D, the thermal conduit 110 may be disposed in direct or indirect thermal contact with at least one additional electronic component 216. In some examples, the thermal conduit 110 may be disposed in direct or indirect thermal contact with multiple additional electronic components.

In some examples, the thermal pathway 116 may be disposed in direct contact with the additional electronic component 216 and may draw thermal energy from the additional electronic component through the second material 120 and transfer the thermal energy to the first material 118, which in turn, transfers the thermal energy to the housing 104 (or other location) of the electronic device. Alternatively, the second material 120 may include a gap such that the first material 118 may be disposed in direct contact with the additional electronic component 216.

Additionally, or alternatively, in some examples, the thermal management system 102 may include an additional thermal conduit 218 disposed between the additional electronic component 216. The additional thermal conduit 218 may be configured to transfer thermal energy from the additional electronic component 206 to the thermal pathway 116. In some examples, the additional thermal conduit 218 may be disposed in contact with the second material 120. However, in an example where the second material 120 includes a gap therein, the additional thermal conduit 218 may be disposed in contact with the first material. In some examples, the additional thermal conduit 218 may be a metallic strap (or conduit) such as a copper strap, a secondary thermal conduit that is substantially similar to the thermal conduit 110 described herein, another portion of the silicone matrix 206, an adhesive, or other material. The additional thermal conduit 218 may include any length necessary to bridge a gap between the additional electronic component 216 and the thermal pathway 116.

Figure 3:
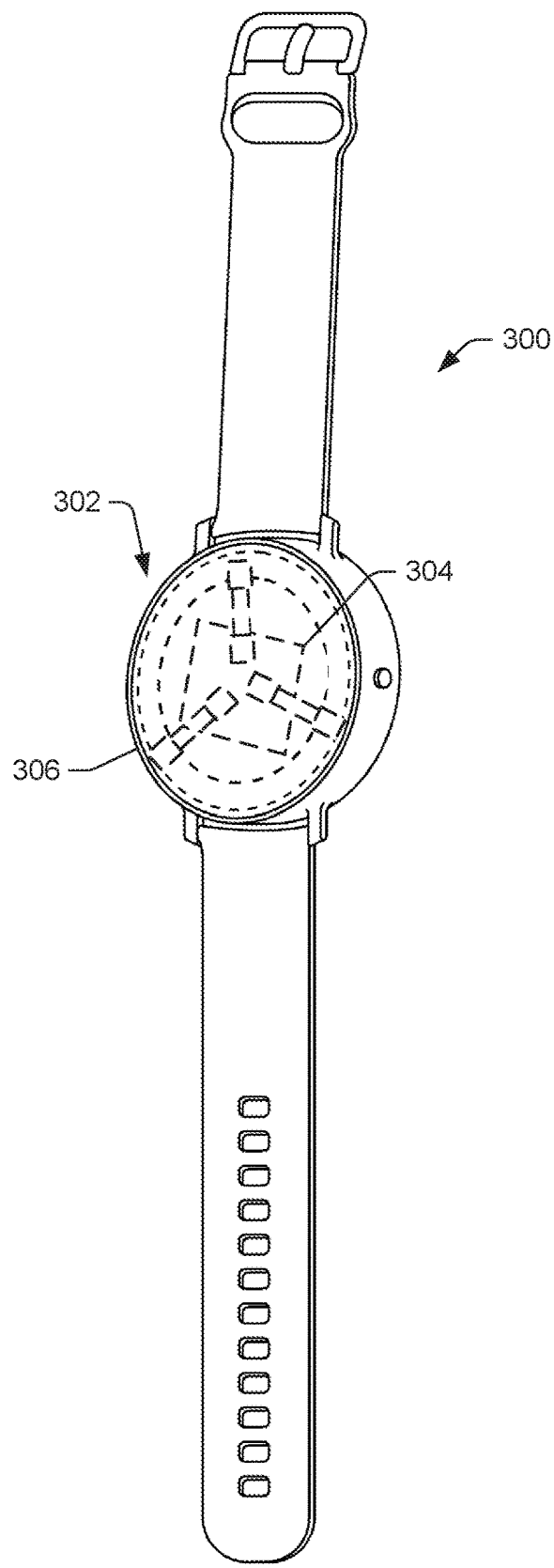
FIG. 3 illustrates a perspective view of another electronic device having a thermal management system in accordance with an example of the present disclosure.

FIG. 3 illustrates another example electronic device 300 having one or more thermal conduits 302. The thermal conduit(s) 302 shown in FIG. 3 may be substantially similar to the thermal conduit 110 shown and described with respect to FIGS. 1-2C. As shown in FIG. 3, the electronic device 300 may include a wrist wearable device (e.g., a smartwatch, fitness band, or controller), a hand wearable device, a head-mounted device (e.g., an electronic headset device), or other wearable device.

Similar to the electronic device 100 described above, the electronic device 300 of FIG. 3 includes a heat source 304 (e.g., one or more processors, radios, and/or other electronics) located within a housing 306 of the electronic device 300. The thermal conduit(s) 302 may be configured to draw thermal energy from the heat source 304 and to transfer the thermal energy to the housing 306 of the electronic device 300.

In this example, three thermal conduits 302 are illustrated extending radially outward from a central region of the electronic device and are spaced substantially uniformly around a circumference of the electronic device (e.g., approximately 120 degrees apart). The thermal conduits 302 thermally couple the heat source 304 to an outer perimeter of a housing 306 of the electronic device 300. While three thermal conduits 302 are shown in this example, in other examples any number of thermal conduits may be used, and may be spaced uniformly or non-uniformly throughout an electronic device. Additionally, while the electronic device 300 in this example is shown to be generally circular, in other examples, electronic devices according to this application may be rectangular, hexagonal, oval, trapezoidal, or any other desired shape. Also, while the thermal conduits 302 in this example are shown extending radially outward, in other examples, thermal conduits may be positioned at other locations and/or orientations within an electronic device to efficiently transmit heat from a heat source to a heat sink or thermal ground.

While not shown in FIG. 3, it is to be understood that the thermal conduit(s) 302 of the electronic device 300 may include substantially the same components as the thermal conduit 110 shown and described in FIGS. 1 and 2A, 2B, and/or 2C. For example, the thermal conduit(s) 302 includes a thermal pathway formed from a first material forming a core of the thermal pathway and a second material encasing the first material. The thermal conduit(s) 302 may further include a silicone matrix bonded to ends of the thermal pathway and coupled to components of the electronic device 300.

CONCLUSION

Although the discussion above sets forth example implementations of the described techniques and structural features, other architectures may be used to implement the described functionality and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the structural features and/or methodological acts may be rearranged and/or combined with each other and/or other structural features and/or methodological acts. In various examples, one or more of the structural features and/or methodological acts may be omitted.

What is claimed is:

1. A wearable device comprising:
   a housing;
   an electronic component disposed within the housing; and
   a thermal conduit disposed within the housing such that a first end of the thermal conduit is disposed in thermal contact with the electronic component and a second end of the thermal conduit is disposed in thermal contact with the housing, wherein the thermal conduit includes:
      a first material forming a core of the thermal conduit, the first material extending along an axial length of the thermal conduit,
      a second material coating at least a portion of the first material and extending along at least a portion of the axial length of the thermal conduit,
      a first thermally conductive silicone defining a first end of the thermal conduit, wherein the first thermally conductive silicone is disposed over a perimeter of a first end of the first material and the second material and is in direct contact with a first end portion of a top surface of the first material and a corresponding first end portion of a top surface of the second material, and
      a second thermally conductive silicone defining a second end of the thermal conduit, opposite the first end of the thermal conduit, wherein the second thermally conductive silicone is disposed over a perimeter of a second end of the first material and the second material and is in direct contact with a second end portion of the top surface of the first material and a corresponding second end portion of the top surface of the second material.

2. The wearable device of claim 1, wherein the first material and the second material form a flexible portion of the thermal conduit.

3. The wearable device of claim 1, wherein the first material comprises pyrolytic graphite and the second material comprises copper or polyethylene terephthalate.

4. The wearable device of claim 1, wherein the first thermally conductive silicone and second thermally conductive silicone are compressible.

5. The wearable device of claim 1, wherein the first thermally conductive silicone defining the first end of the thermal conduit is coupled to the electronic component and the second thermally conductive silicone defining the second end of the thermal conduit is coupled to the housing.

6. The wearable device of claim 1, wherein the first material has a thickness between approximately 25 microns and 175 microns.

7. The wearable device of claim 1, wherein the first material and the second material form a thermal pathway and the thermal pathway has a thickness between approximately 35 microns and approximately 195 microns.

8. The wearable device of claim 1, wherein the first material includes thermal conductivity of at least 900 W/m-K.

9. The wearable device of claim 1, wherein the second material is bonded to the first material via a pressure sensitive adhesive.

10. An electronic device comprising:
    an electronic component;
    a thermal ground; and
    a flexible thermal conduit having a first end coupled to the electronic component and a second end coupled to the thermal ground, such that the thermal conduit draws thermal energy from the electronic component and transfers the thermal energy to the thermal ground, wherein the thermal conduit includes:
       a first material extending along an axial length of the thermal conduit, the first material having a first thermal conductivity,
       a second material encasing at least a portion of the first material, the second material having a second thermal conductivity that is less than the first thermal conductivity,
       a first thermally conductive silicone defining a first end of the thermal conduit, wherein the first thermally conductive silicone is disposed over a perimeter of a first end of the first material and the second material and is in direct contact with a first end portion of a top surface of the first material and a corresponding first end portion of a top surface of the second material, and
       a second thermally conductive silicone defining a second end of the thermal conduit, opposite the first end of the thermal conduit, wherein the second thermally conductive silicone is disposed over a perimeter of a second end of the first material and the second material and is in direct contact with a second end portion of the top surface of the first material and a corresponding second end portion of the top surface of the second material.

11. The electronic device of claim 10, wherein the thermal ground comprises a housing of the electronic device.

12. The electronic device of claim 10, wherein the first thermally conductive silicone defining the first end of the thermal conduit is coupled to the electronic component and the second thermally conductive silicone defining the second end of the thermal conduit is coupled to the thermal ground.

13. The electronic device of claim 10, wherein the second material is bonded to the first material via a pressure sensitive adhesive.

14. The electronic device of claim 10, wherein the first thermally conductive silicone and the second thermally conductive silicone adheres more strongly to the second material than the first material.

15. The electronic device of claim 10, wherein the first material comprises pyrolytic graphite and the second material comprises copper or polyethylene terephthalate.

16. The electronic device of claim 10, wherein the second material is wetted to the first material to bond the second material to the first material.

17. A thermal conduit comprising:
  a thermal pathway having a first end and a second end, the thermal pathway including:
    a first material extending along an axial length of the thermal pathway of the thermal conduit, the first material having a first thermal conductivity,
    a second material encasing at least a portion of the first material, the second material having a second thermal conductivity that is less than the first thermal conductivity,
  a first thermally conductive silicone defining a first end of the thermal conduit, wherein the first thermally conductive silicone is disposed over a perimeter of a first end of the first material and the second material and is in direct contact with a first end portion of a top surface of the first material and a corresponding first end portion of a top surface of the second material, and
  a second thermally conductive silicone defining a second end of the thermal conduit, opposite the first end of the thermal conduit, wherein the second thermally conductive silicone is disposed over a perimeter of a second end of the first material and the second material and is in direct contact with a second end portion of the top surface of that the first material and a corresponding second end portion of the top surface of the second material.

18. The thermal conduit of claim 17, wherein the first material comprises pyrolytic graphite and the second material comprises copper or polyethylene terephthalate.

19. The thermal conduit of claim 17, wherein the thermal pathway is flexible and the first thermally conductive silicone is coupled to a first component and the second thermally conductive silicone is coupled to a second component such that the thermal conduit draws thermal energy from the first component and transfers the thermal energy to the second component.

20. The electronic device of claim 10, wherein a length of the first material is configured to extend beyond an entire length of the second material.

* * * * *